US012538784B1

(12) United States Patent
Zhao et al.

(10) Patent No.: US 12,538,784 B1
(45) Date of Patent: Jan. 27, 2026

(54) POWER TERMINAL SHARING WITH NOISE ISOLATION (71) Applicant: Marvell Asia Pte Ltd, Singapore (SG)

(72) Inventors: Hui Zhao, San Jose, CA (US); Fei Lu, San Jose, CA (US); Yuxiang Sun, San Jose, CA (US); Zhendong Guo, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 550 days.

(21) Appl. No.: 17/936,010

(22) Filed: Sep. 28, 2022

Related U.S. Application Data (60) Provisional application No. 63/250,191, filed on Sep. 29, 2021.

(51) Int. Cl.
H01L 23/522 (2006.01)
H01L 23/00 (2006.01)
H01L 23/525 (2006.01)
H01L 23/528 (2006.01)
H01L 23/552 (2006.01)
H03H 7/01 (2006.01)

(52) U.S. Cl.
CPC ...... H01L 23/5225 (2013.01); H01L 23/5223 (2013.01); H01L 23/5227 (2013.01); H01L 23/525 (2013.01); H01L 23/5286 (2013.01); H01L 23/552 (2013.01); H01L 24/14 (2013.01); H03H 7/0153 (2013.01); H03H 7/1741 (2013.01); H01L 2224/14152 (2013.01); H01L 2224/14153 (2013.01); H01L 2224/14515 (2013.01); H01L 2924/1421 (2013.01); H01L 2924/30105 (2013.01); H01L 2924/30107 (2013.01); H01L 2924/3025 (2013.01)

(58) Field of Classification Search
CPC ............. H01L 23/5225; H01L 23/5223; H01L 23/5227; H01L 23/525; H01L 23/5286; H01L 23/552; H01L 24/14; H01L 2224/14152; H01L 2224/14153; H01L 2224/14515; H01L 2924/1421; H01L 2924/30105; H01L 2924/30107; H01L 2924/3025; H01L 23/5222; H01L 24/12; H03H 7/0153; H03H 7/1741; H03K 17/16
See application file for complete search history.

(56) References Cited

U.S. PATENT DOCUMENTS 4,084,217 A * 4/1978 Brandli ............... H02M 1/4266
315/176

* cited by examiner

Primary Examiner — Jung Kim (57) ABSTRACT

An integrated circuit device, having a first number of terminals, and a first plurality of functional circuits including a second number of functional circuits requiring access to the terminals in the first number of terminals, where the second number is greater than the first number, includes a second plurality of functional circuits from among the first plurality of functional circuits, the second plurality of functional circuits sharing access to a shared terminal among the first number of terminals, and a respective isolation circuit between the shared terminal among the first number of terminals and each respective functional circuit in the second plurality of functional circuits, the respective isolation circuit being configured to prevent coupling of noise from one respective functional circuit in the second plurality of functional circuits to another respective functional circuit in the second plurality of functional circuits via the shared terminal.

22 Claims, 7 Drawing Sheets

POWER TERMINAL SHARING WITH NOISE ISOLATION

CROSS REFERENCE TO RELATED APPLICATION

This disclosure claims the benefit of, commonly-assigned U.S. Provisional Patent Application No. 63/250,191, filed Sep. 29, 2021, which is hereby incorporated by reference herein in its entirety.

FIELD OF USE

This disclosure relates to sharing of power terminals by different circuits in integrated circuit devices. More particularly, this disclosure relates to sharing of power terminals (especially power and ground bumps in a bump array) by different circuits in integrated circuit devices, with isolation circuitry to prevent noise from coupling between circuits via the power terminals.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices provide various forms of terminals for coupling to external devices and power sources. The different forms of terminals range from more traditional pads or pins to more-recently developed "bump arrays," but any form of terminal has a minimum physical size to which connections can be made. Therefore, as semiconductor feature sizes (i.e., "process nodes") become smaller, allowing more circuits to be formed on an integrated circuit device, the number of available terminals cannot increase at the same rate.

SUMMARY

In accordance with implementations of the subject matter of this disclosure, an integrated circuit device, having a first number of terminals, and a first plurality of functional circuits including a second number of functional circuits requiring access to the terminals in the first number of terminals, where the second number is greater than the first number, includes a second plurality of functional circuits from among the first plurality of functional circuits, the second plurality of functional circuits sharing access to a shared terminal among the first number of terminals, and a respective isolation circuit between the shared terminal among the first number of terminals and each respective functional circuit in the second plurality of functional circuits, the respective isolation circuit being configured to prevent coupling of noise from one respective functional circuit in the second plurality of functional circuits to another respective functional circuit in the second plurality of functional circuits via the shared terminal.

In a first implementation of such an integrated circuit device, the terminals in the first plurality of terminals may include an array of bump contacts.

In a second implementation of such an integrated circuit device, the terminals in the first plurality of terminals may include at least one of power terminals and ground terminals.

According to a first aspect of that second implementation, the respective isolation circuit may include a first capacitor coupled to one of the power terminals and one of the ground terminals as a first decoupling shunt, a first inductor coupled inline between the one of the ground terminals and a ground connection of the respective functional circuit, and at least one second-order low-pass filter network coupled between the one of the power terminals and the one of the ground terminals.

In a first instance of that first aspect, each respective one of the least one second-order low-pass filter network may be an L-C network including a respective second inductor coupled inline between the one of the power terminals and a power connection of the respective functional circuit, and a respective second capacitor coupled between the respective second inductor and ground as a respective second decoupling shunt.

In a first occurrence of that first instance, the respective second inductor may be a variable inductor.

In a first variant of that first occurrence, the variable inductor may include a third number of inductors, and at least one switch for selectably excluding or including an individual inductor of the third number of inductors.

In a second occurrence of that first instance, each respective second capacitor may be a respective variable capacitor.

In a first variant of that second occurrence, the respective variable capacitor may include a fourth number of capacitors, and respective switches for selectably excluding or including respective individual capacitors of the fourth number of capacitors.

In a second variant of that second occurrence, the respective variable capacitor may include a voltage-controlled capacitor.

In accordance with implementations of the subject matter of this disclosure, a method of fabricating an integrated circuit device having a first number of terminals, and a first plurality of functional circuits including a second number of functional circuits requiring access to the terminals in the first number of terminals, where the second number is greater than the first number, includes forming a second plurality of functional circuits from among the first plurality of functional circuits, the second plurality of functional circuits sharing access to a shared terminal among the first number of terminals, and forming a respective isolation circuit between the shared terminal among the first number of terminals and each respective functional circuit in the second plurality of functional circuits, the respective isolation circuit being configured to prevent coupling of noise from one respective functional circuit in the second plurality of functional circuits to another respective functional circuit in the second plurality of functional circuits via the shared terminal.

A first implementation of such a method may include forming the terminals in the first plurality of terminals as an array of bump contacts.

A second implementation of such a method may include forming at least one of power terminals and ground terminals among the terminals in the first plurality of terminals.

According to a first aspect of that second implementation, forming the respective isolation circuit may include coupling a first capacitor to one of the power terminals and one of the ground terminals as a first decoupling shunt, coupling a first inductor inline between the one of the ground terminals and a ground connection of the respective functional circuit, and coupling at least one second-order low-pass filter network between the one of the power terminals and the one of the ground terminals.

In a first instance of that first aspect, forming each respective one of the least one second-order low-pass filter network may include forming an L-C network by coupling a respective second inductor inline between the one of the power terminals and a power connection of the respective functional circuit, and coupling a respective second capacitor between the respective second inductor and ground as a respective second decoupling shunt.

A first occurrence of that first instance may include forming the respective second inductor as a variable inductor.

A first variant of that first occurrence may include forming the variable inductor as a third number of inductors, and switches for selectably excluding or including individual inductors of the third number of inductors.

A second occurrence of that first instance may include forming each respective second capacitor as a respective variable capacitor.

A first variant of that second occurrence may include forming the respective variable capacitor as a fourth number of capacitors, and switches for selectably excluding or including individual capacitors of the fourth number of capacitors.

A second variant of that second occurrence may include forming the respective variable capacitor as a voltage-controlled capacitor.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, integrated circuit devices provide various forms of terminals for coupling to external devices and power sources. The different forms of terminals range from more traditional pads or pins to more-recently developed "bump" terminals, which are typically arranged on a major surface of the device exterior in "bump arrays." Whatever form of terminal is provided, any form of terminal has a minimum physical size to which connections can be made. As semiconductor feature sizes (i.e., "process nodes") become smaller, allowing more circuits to be formed on an integrated circuit device, terminal size cannot decrease at the same rate, limiting any increase in the number of terminals to serve the larger number of circuits. Moreover, even if additional terminals could be made to fit on the device, they may be so close together as to cause interference between signals on adjacent terminals. Therefore it becomes difficult to connect to all of the circuits on an integrated circuit device to terminals without increasing the device size to provide more surface area, or perimeter length, for terminals, even though the increased size is not needed for the circuits themselves.

For certain kinds of connections, especially power and ground connections, it may be possible for more than one circuit on the integrated circuit device to share terminals, reducing the total number of terminals needed and thereby allowing the device to be smaller. However, if two or more circuits on an integrated circuit device share power and/or ground terminals, signals from one circuit may couple to one or more of the other circuits via the power or ground connections, causing interference. This is of particular concern with higher frequency signals—e.g., radiofrequency (RF) signals—as may be found in a transceiver or serializer/deserializer (SERDES) circuit—although in most cases, this is only a concern at the die or chip level, whereas at the package level, the distances involved are such that this type of interference would be expected to be attenuated.

Therefore, in accordance with implementations of the subject matter of this disclosure, multiple functional circuits on an integrated circuit device may share power and/or ground terminals. To minimize or prevent coupling of noise or interference from one functional circuit to another via the common power or ground connection, a respective isolation network may be provided between each functional circuit and the shared power and ground connections.

In implementations of the subject matter of this disclosure, each isolation network may be an L-C isolation network including at least one inline inductor (L) and one capacitor (C) shunt to ground. The inductor is an effective short circuit to DC signals but an effective open circuit to higher-frequency signals, and therefore passes DC power signals inline, but blocks AC (e.g., RF) noise or interference signals. Similarly, the capacitor is an effective open circuit to DC signals but an effective short circuit to higher-frequency signals, and therefore passes AC (e.g., RF) noise or interference signals to ground without diverting DC power signals to ground.

In some implementations, each isolation network may include one or more additional L-C units, each serving as a second-order (or higher-order) low-pass filter (passing power signals but blocking higher-frequency noise or interference signals). The inductor and capacitor values may be selected to adjust bandwidth. A cascaded isolation network of multiple L-C units may provide filtering with sharper roll-off. The inductor and capacitor values may be made programmable to allow tuning or optimization. In some implementations, each inductor may be instantiated as multiple inductors in series or parallel, with programmable or controllable switches allowing a desired effective inductance to be selected. Similarly, in some implementations, each capacitor may be instantiated as multiple capacitors in series or parallel, with programmable or controllable switches allowing a desired effective capacitance to be selected.

The subject matter of this disclosure may be better understood by reference to FIGS. 1-9.

Figure 1:
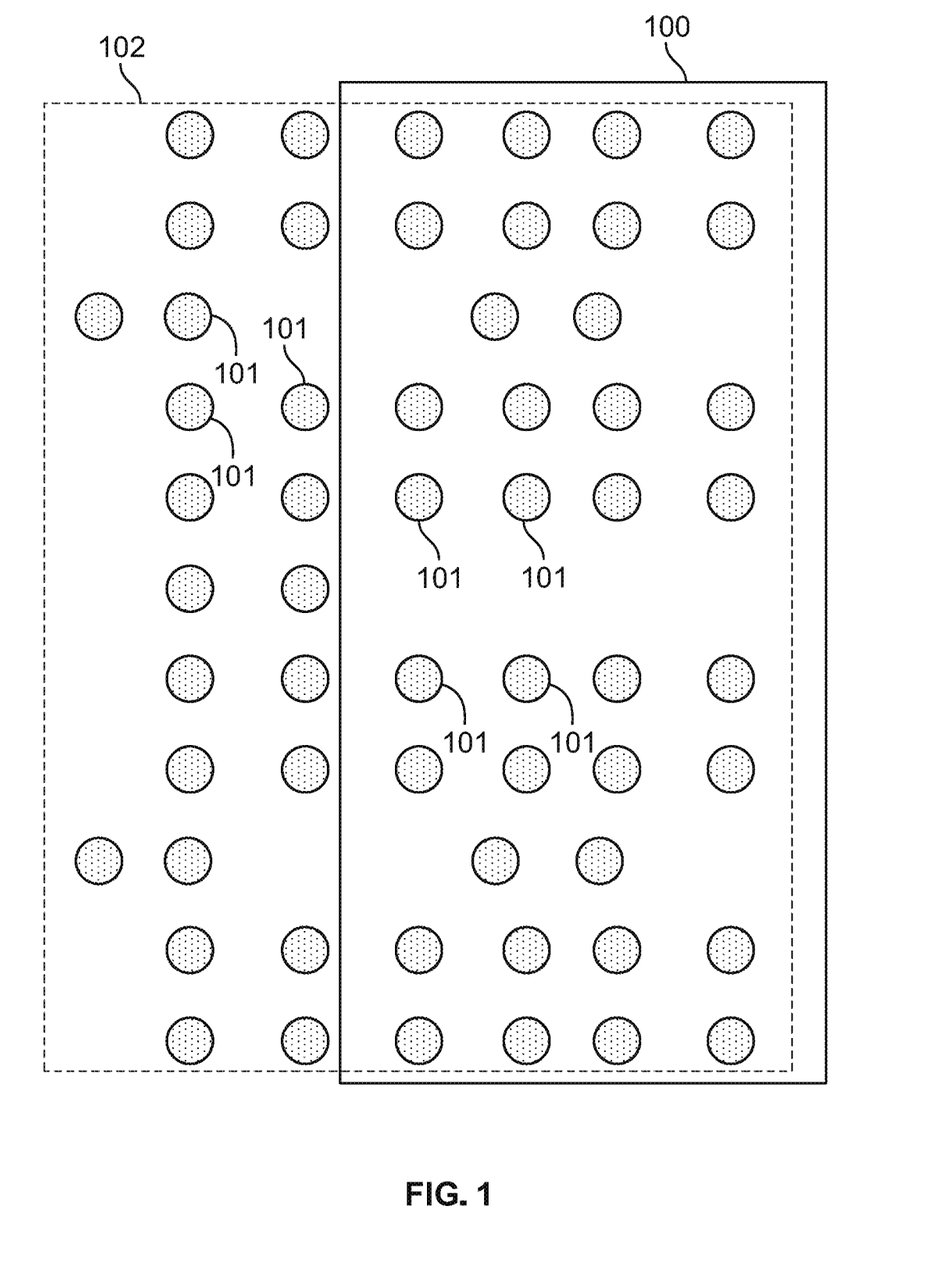
FIG. 1 is a comparison of the size of an integrated circuit device to the area needed for terminals of integrated circuit device.

FIG. 1 illustrates schematically the problem to be solved. Rectangle 100 may represent the outline of an integrated circuit device, while circles 101 represent bumps in a bump array needed to provide terminal access to each circuit on integrated circuit device 100. As depicted, the array 102 of bumps 101 may be substantially larger than the integrated circuit device 100, lessening the advantage achieved by reducing the size of integrated circuit device 100.

Figure 2:
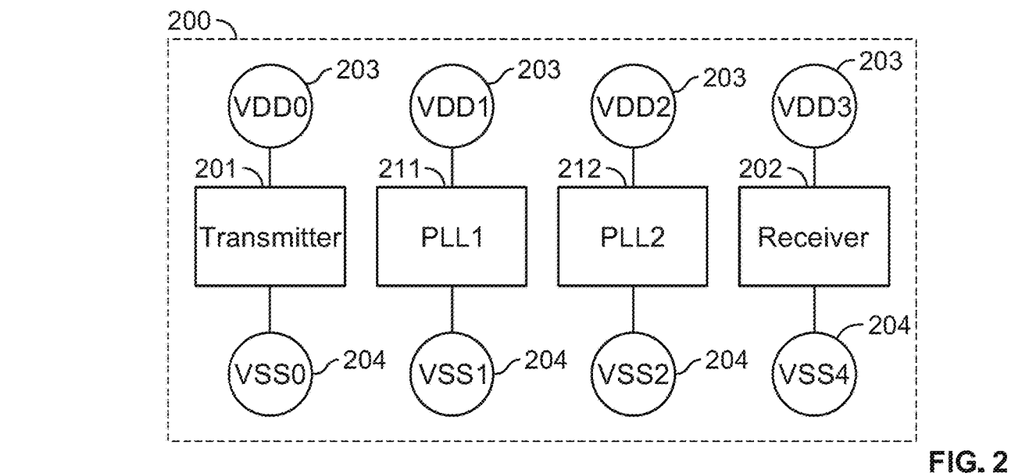
FIG. 2 is a high-level block diagram of the components of a transceiver or serializer/deserializer in a high-speed serial interface device, which may be improved using implementations of the subject matter of this disclosure.

FIG. 2 shows, in a high-level block diagram format, the components of a transceiver or SERDES 200 in a typical high-speed serial interface device—e.g., an Ethernet physical layer transceiver (PHY). The high-speed serial interface device may include several lanes, and each lane may include a transceiver or SERDES having the structure 200 shown in FIG. 2. Transceiver or SERDES structure 200 typically includes transmitter circuitry 201 and receiver circuitry 202. A respective phased-locked loop (PLL) 211, 212 provides a respective clock for transmitter circuitry 201 or receiver circuitry 202. As shown, this typical arrangement requires four power terminals 203 and four ground terminals 204, for a total of eight ground and power terminals per lane of the high-speed serial interface device.

In accordance with implementations of the subject matter of this disclosure, the number of power and ground terminals required for each lane of a high-speed serial interface device in an integrated circuit device may be reduced, in the manner described below, thereby reducing the total number of terminals required by the integrated circuit device. If the terminals are bumps in a bump array, reduction of the total number of terminals will reduce the area required for the bump array, thereby facilitating reduction of the size of the package containing the integrated circuit device. If the terminals are more conventional pads or pins, reduction of the total number of terminals will reduce the perimeter length required for the pads or pins, again facilitating reduction of the size of the package containing the integrated circuit device.

Figure 3:
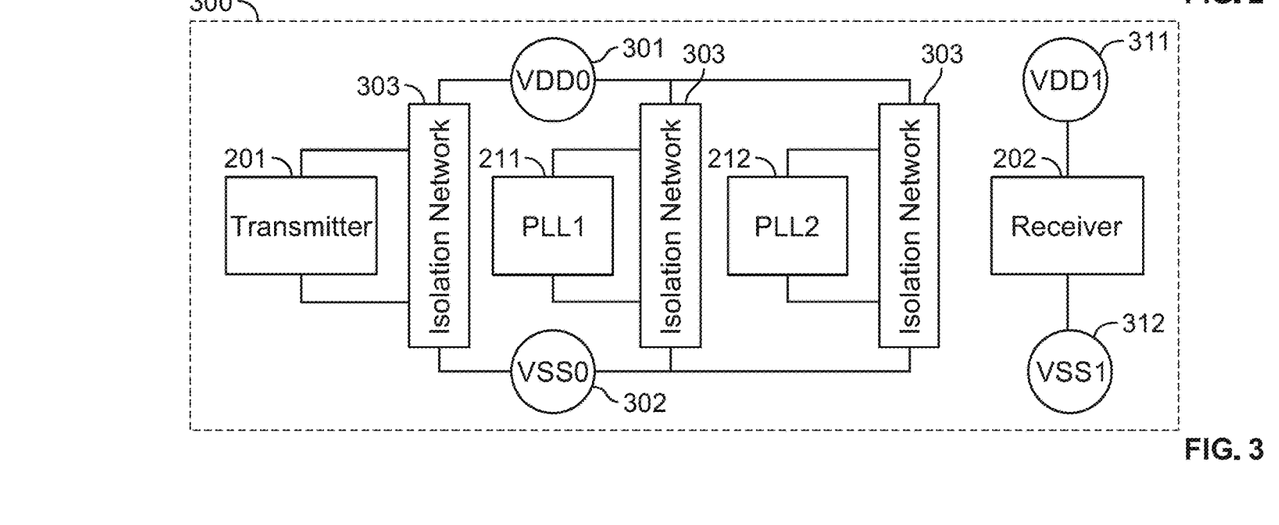
FIG. 3 is a high-level block diagram of the components of a transceiver or serializer/deserializer in a high-speed serial interface device, in accordance with implementations of the subject matter of this disclosure.

As just one example of an implementation of the subject matter of this disclosure, FIG. 3 shows an implementation of a transceiver or SERDES 300, which is similar to transceiver or SERDES 200, having transmitter circuitry 201 and receiver circuitry 202. A respective PLL 211, 212 provides a respective clock for transmitter circuitry 201 or receiver circuitry 202 but requires only two power terminals 301, 311 and two ground terminals 302, 312, which is 50% reduction in the number of power terminals and the number of ground terminals, and therefore a 50% reduction in the total number of power and ground terminals.

The reduction in the number of power and ground terminals in transceiver or SERDES 300 (as compared to transceiver or SERDES 200) is achieved, in the illustrated implementation, by having transmitter circuitry 201 and both PLLs 211, 212 share power terminal 301 and ground terminals 302, while receiver circuitry 202 is coupled on its own to power terminal 311 and ground terminal 312. Because receiver circuitry 202 does not share its power terminal 311 or its ground terminal 312, there is no concern of coupling of noise from any other circuit to receiver circuitry 202 via power terminal 311 or ground terminal 312. However, in order to prevent the coupling of signals, in one of the circuits in the group that includes transmitter circuitry 201 and PLLs 211, 212, as noise to another one of the circuits in the group that includes transmitter circuitry 201 and PLLs 211, 212, SERDES 300 includes a respective isolation network 303 between power terminal 301 and ground terminal 302 and each one of the circuits in the group that includes transmitter circuitry 201 and PLLs 211, 212.

In an alternative arrangement (not shown), transmitter circuitry 201 and PLL 211 may share one pair of power and ground terminals 301, 302, while receiver circuitry 202 and PLL 212 share another pair of power and ground terminals 311, 312. However, in such an arrangement, an isolation network 303 would be needed between transmitter circuitry 201 and power and ground terminals 301, 302, between PLL 211 and power and ground terminals 301, 302, between receiver circuitry 202 and power and ground terminals 311, 312, and between PLL 212 and power and ground terminals 311, 312. Thus, such an alternative arrangement would require four isolation networks 303, rather than the three isolation networks 303 required in transceiver or SERDES 300.

Figure 4:
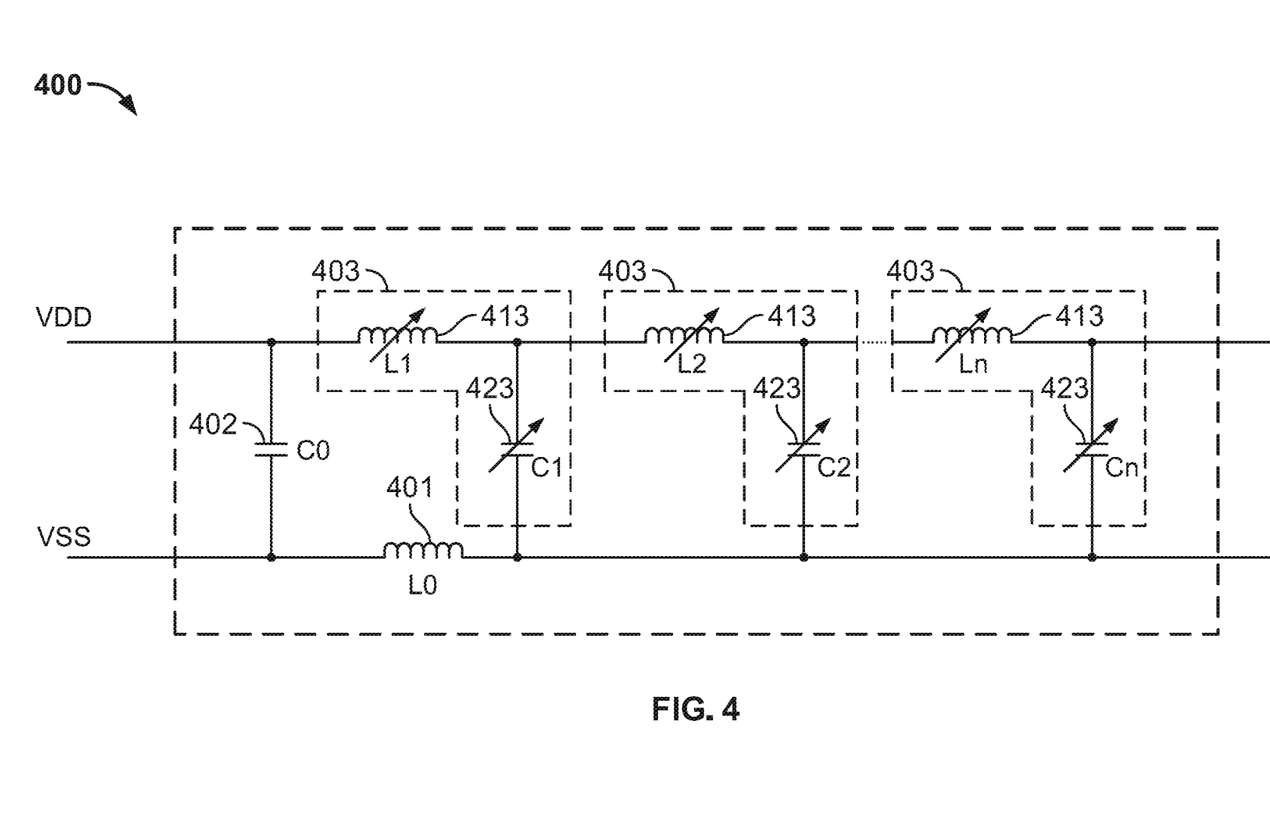
FIG. 4 is a representation of an isolation network that may be used in the transceiver or serializer/deserializer of FIG. 3, in accordance with implementations of the subject matter of this disclosure.

The details of an implementation 400 of isolation network 303 are described in FIG. 4. Isolation network 400 may be an L-C isolation network including at least one inline inductor (L0) 401 and one capacitor (C0) 402 shunted to ground. Inductor 401 acts as an effective short circuit to DC signals but an effective open circuit to higher-frequency signals, and therefore passes DC power signals inline, but blocks AC (e.g., RF) noise or interference signals. Similarly, capacitor 402 acts as an effective open circuit to DC signals but an effective short circuit to higher-frequency signals, and therefore passes AC (e.g., RF) noise or interference signals to ground without diverting DC power signals to ground. In some implementations, isolation network 400 may include one or more additional L-C units 403, each including an additional inductor (L1, . . . , Ln) 413 and an additional capacitor (C1, . . . , Cn) serving as a second-order (or higher-order) low-pass filter (passing power signals but blocking higher-frequency noise or interference signals). The inductors 413 and capacitors 423 may have adjustable, programmable or selectable values to allow tuning or optimization to adjust bandwidth. A cascaded isolation network of multiple L-C units 403 as shown may provide filtering with sharper roll-off.

Figure 5:
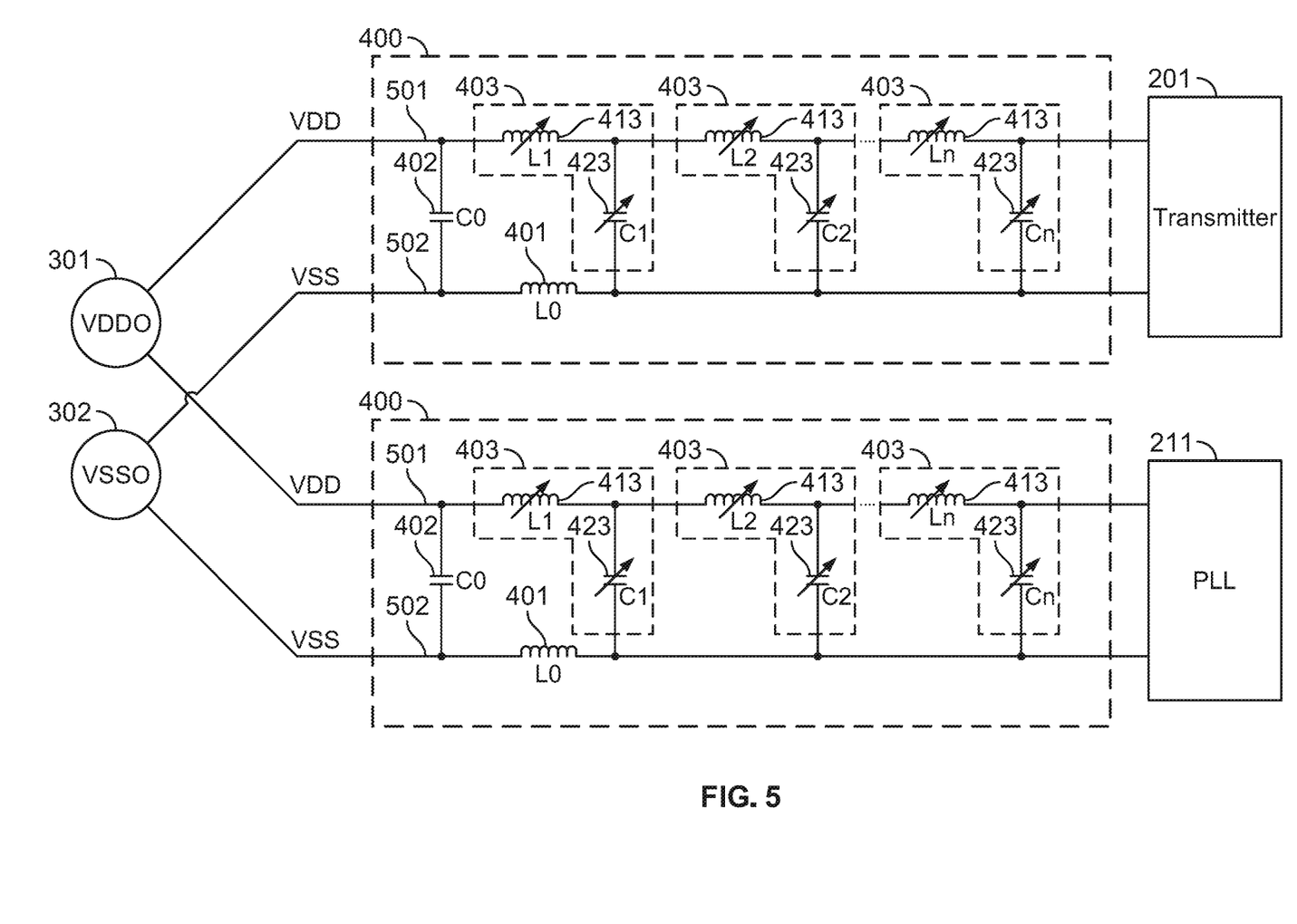
FIG. 5 shows details of the coupling of a plurality of isolation networks as in FIG. 4 to components of a transceiver or serializer/deserializer in a high-speed serial interface device, in accordance with implementations of the subject matter of this disclosure.

Details of how the plurality of isolation networks 303 (illustrated as implementations 400) may be coupled to power terminal 301, ground terminal 302, and respective ones of transmitter circuitry 201 and PLL 211 are shown in FIG. 5, where a power "rail" 501 of each isolation network 400 is coupled to power terminal 301 and a respective one of transmitter circuitry 201 and PLL 211, and a ground "rail" 502 of each isolation network 400 is coupled to ground terminal 302 and a respective one of transmitter circuitry 201 and PLL 211. An additional isolation network 303 (not shown) couples power terminal 301 and ground terminal 302 to PLL 212.

Figure 6:
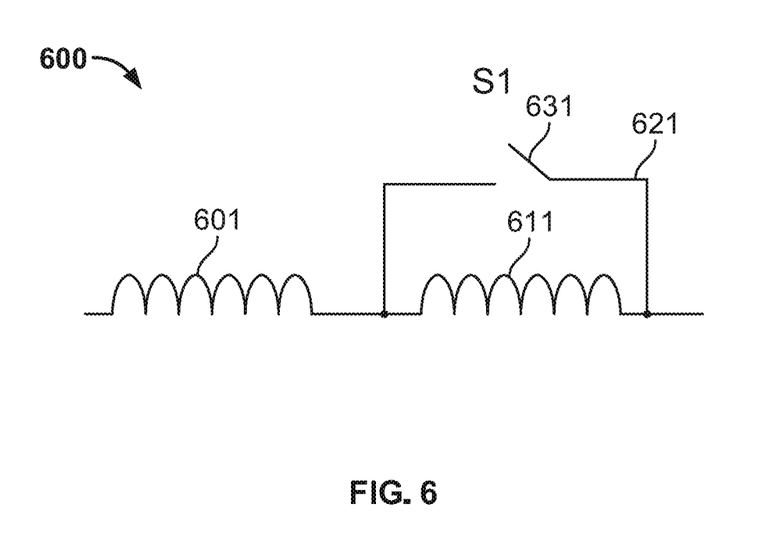
FIG. 6 shows an implementation of a variable inductor for use in an isolation network in accordance with implementations of the subject matter of this disclosure.

FIG. 6 shows an implementation 600 of a variable inductor that may be used as variable inductor 413 in isolation network 303. Variable inductor 600 includes two fixed inductors 601, 611 coupled in series. A bypass path 621, controlled by switch 631—which may be a programmable or controllable transistor switch (not shown)—allows inductor 611 to be removed from the circuit. Therefore, in this implementation, variable inductor 600 may have one of two inductance values—i.e., the inductance value of inductors 601, 611 in series when switch 631 is open, or the inductance value of inductor 601 alone when switch 631 is closed. A parallel arrangement (not shown) of inductors, instead of series arrangement 600, may also be provided.

Figure 7:
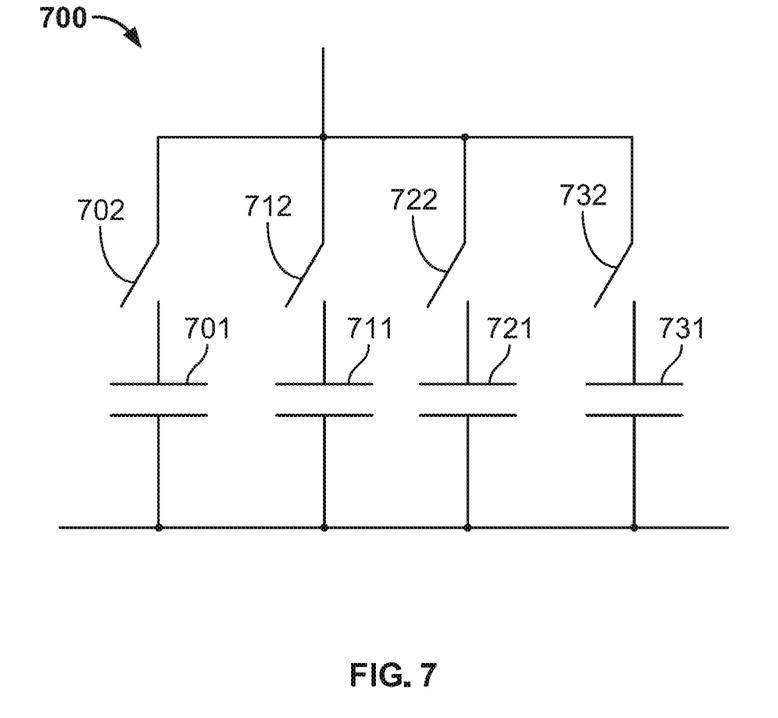
FIG. 7 shows an implementation of a variable capacitor for use in an isolation network in accordance with implementations of the subject matter of this disclosure.

FIG. 7 shows an implementation 700 of a variable capacitor that may be used as variable capacitor 423 in isolation network 303. Variable capacitor 700 includes a plurality (four shown in this implementation) of fixed capacitors 701, 711, 721, 731 coupled in parallel. A respective switch 702, 712, 722, 732—each of which may be a programmable or controllable transistor switch (not shown)—allows each of capacitors 701, 711, 721, 731 to be controllably included or excluded from the circuit. Each of switches 702, 712, 722, 732 may be open or closed, allowing variable capacitor 700 to have a capacitance value equal to the parallel combination of one, two, three or all four of capacitors 701, 711, 721, 731, depending on which of switches 702, 712, 722, 732 is open or closed. A series arrangement (not shown) of capacitors, instead of parallel arrangement 700, may also be provided.

Figure 8:
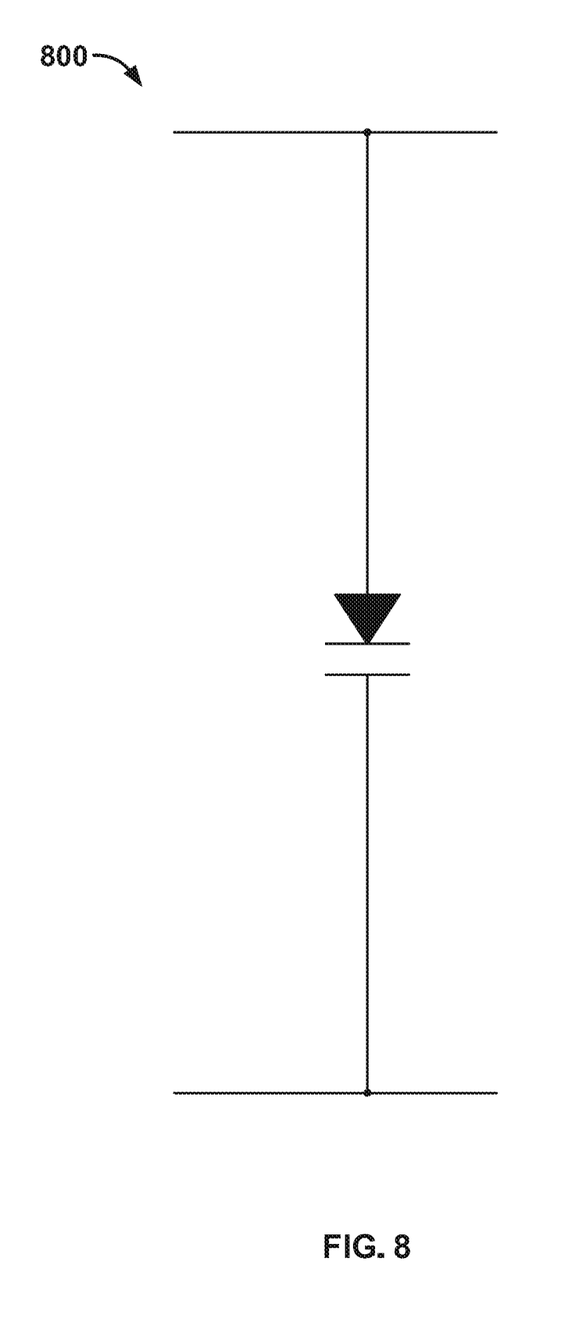
FIG. 8 shows an alternate implementation of a variable capacitor for use in an isolation network in accordance with implementations of the subject matter of this disclosure.

Alternatively, as shown in FIG. 8, variable capacitor 423 may be a controllable variable capacitor such as a varactor diode 800, whose capacitance is a function of the voltage across varactor diode 800.

Figure 9:
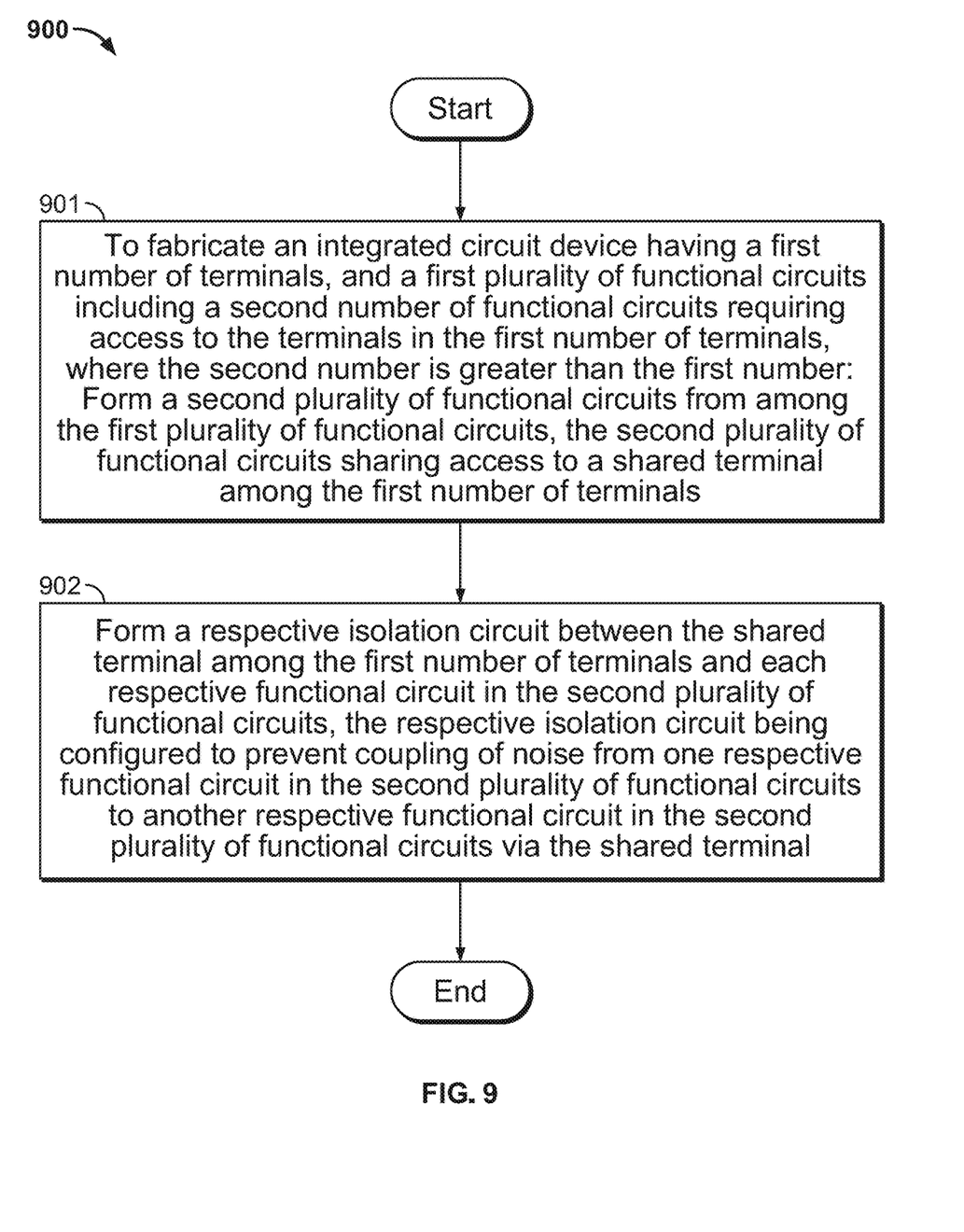
FIG. 9 is a flow diagram illustrating a method in accordance with implementations of the subject matter of this disclosure.

A method 900 according to implementations of the subject matter of this disclosure for fabricating an integrated circuit device having a first number of terminals, and a first plurality of functional circuits including a second number of functional circuits requiring access to the terminals in the first number of terminals, where the second number is greater than the first number, is diagrammed in FIG. 9. Method 900 begins at 901, where, to fabricate an integrated circuit device having a first number of terminals, and a first plurality of functional circuits including a second number of functional circuits requiring access to the terminals in the first number of terminals, where the second number is greater than the first number, a second plurality of functional circuits from among the first plurality of functional circuits is formed, the second plurality of functional circuits sharing access to a shared terminal among the first number of terminals. At 902, a respective isolation circuit is formed between the shared terminal among the first number of terminals and each respective functional circuit in the second plurality of functional circuits, the respective isolation circuit being configured to prevent coupling of noise from one respective functional circuit in the second plurality of functional circuits to another respective functional circuit in the second plurality of functional circuits via the shared terminal. Method 900 then ends.

Thus it is seen that the sharing of power terminals (especially power and ground bumps in a bump array) by different circuits in integrated circuit devices, with isolation circuitry to prevent noise from coupling between circuits via the power terminals, thereby reducing the total number of terminals needed in devices with limited space for additional terminals, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit device having a first number of terminals, and a first plurality of functional circuits formed on the integrated circuit device, including a second number of functional circuits formed on the integrated circuit device and requiring access to the terminals in the first number of terminals, where the second number is greater than the first number, the integrated circuit device comprising:
    a second plurality of functional circuits formed on the integrated circuit device, from among the first plurality of functional circuits formed on the integrated circuit device, the second plurality of functional circuits sharing access to a shared terminal among the first number of terminals; and
    a respective isolation circuit including an inductor and a capacitor formed on the integrated circuit device between the shared terminal among the first number of terminals and each respective functional circuit in the second plurality of functional circuits, the respective isolation circuit being configured to prevent coupling of noise from one respective functional circuit to another respective functional circuit via the shared terminal.

2. The integrated circuit device of claim 1 wherein the terminals in the first number of terminals comprise an array of bump contacts.

3. The integrated circuit device of claim 1 wherein the terminals in the first number of terminals comprise at least one of power terminals and ground terminals.

4. The integrated circuit device of claim 3 wherein the respective isolation circuit formed on the integrated circuit device comprises:
    a first capacitor, formed on the integrated circuit device, coupled to one of the power terminals and one of the ground terminals as a first decoupling shunt;
    a first inductor, formed on the integrated circuit device, coupled inline between the one of the ground terminals and a ground connection of the respective functional circuit formed on the integrated circuit device; and
    at least one second-order low-pass filter network formed on the integrated circuit device and coupled between the one of the power terminals and the one of the ground terminals.

5. The integrated circuit device of claim 4 wherein each respective one of the least one second-order low-pass filter network is an L-C network comprising:
    a respective second inductor formed on the integrated circuit device and coupled inline between the one of the power terminals and a power connection of the respective functional circuit formed on the integrated circuit device; and
    a respective second capacitor formed on the integrated circuit device and coupled between the respective second inductor and ground as a respective second decoupling shunt.

6. The integrated circuit device of claim 5 wherein the respective second inductor is a variable inductor.

7. The integrated circuit device of claim 6 wherein the variable inductor comprises a third number of inductors, and at least one switch for selectably excluding or including an individual inductor of the third number of inductors.

8. The integrated circuit device of claim 5 wherein each respective second capacitor is a respective variable capacitor.

9. The integrated circuit device of claim 8 wherein the respective variable capacitor comprises a fourth number of capacitors, and respective switches for selectably excluding or including respective individual capacitors of the fourth number of capacitors.

10. The integrated circuit device of claim 8 wherein the respective variable capacitor comprises a voltage-controlled capacitor.

11. A method of fabricating an integrated circuit device having a first number of terminals, and a first plurality of functional circuits, the first plurality of functional circuits including a second number of functional circuits formed on the integrated circuit device and requiring access to the terminals in the first number of terminals, where the second number is greater than the first number, the method comprising:

forming a second plurality of functional circuits on the integrated circuit device from among the first plurality of functional circuits formed on the integrated circuit device, including forming the second plurality of functional circuits to share access to a shared terminal among the first number of terminals; and forming a respective isolation circuit including an inductor and a capacitor on the integrated circuit device between the shared terminal among the first number of terminals and each respective functional circuit in the second plurality of functional circuits, the respective isolation circuit being configured to prevent coupling of noise from one respective functional circuit in the second plurality of functional circuits to another respective functional circuit in the second plurality of functional circuits via the shared terminal.

12. The method of fabricating an integrated circuit device according to claim 11 comprising forming the terminals in the first plurality number of terminals as an array of bump contacts.

13. The method of fabricating an integrated circuit device according to claim 11 comprising forming at least one of power terminals and ground terminals among the terminals in the first plurality number of terminals.

14. The method of fabricating an integrated circuit device according to claim 13 wherein forming the respective isolation circuit on the integrated circuit device comprises:

coupling a first capacitor to one of the power terminals and one of the ground terminals as a first decoupling shunt;

coupling a first inductor inline between the one of the ground terminals and a ground connection of the respective functional circuit on the integrated circuit device; and coupling at least one second-order low-pass filter network on the integrated circuit device between the one of the power terminals and the one of the ground terminals.

15. The method of fabricating an integrated circuit device according to claim 14 wherein forming each respective one of the least one second-order low-pass filter network comprises forming an L-C network by:

coupling a respective second inductor inline between the one of the power terminals and a power connection of the respective functional circuit on the integrated circuit device; and coupling a respective second capacitor between the respective second inductor and ground as a respective second decoupling shunt.

16. The method of fabricating an integrated circuit device according to claim 15 comprising forming the respective second inductor as a variable inductor.

17. The method of fabricating an integrated circuit device according to claim 16 comprising forming the variable inductor as a third number of inductors, and switches for selectably excluding or including individual inductors of the third number of inductors.

18. The method of fabricating an integrated circuit device according to claim 15 comprising forming each respective second capacitor as a respective variable capacitor.

19. The method of fabricating an integrated circuit device according to claim 18 comprising forming the respective variable capacitor as a fourth number of capacitors, and switches for selectably excluding or including individual capacitors of the fourth number of capacitors.

20. The method of fabricating an integrated circuit device according to claim 18 comprising forming the respective variable capacitor as a voltage-controlled capacitor.

21. The method of fabricating an integrated circuit device according to claim 13 wherein:

forming at least one of power terminals and ground terminals among the terminals in the first number of terminals comprises forming both power terminals and ground terminals among the terminals in the first number of terminals;

forming the second plurality of functional circuits to share access to a shared terminal among the first number of terminals comprises forming the second plurality of functional circuits to share access to a shared power terminal and to share access to a shared ground terminal;

forming a respective isolation circuit on the integrated circuit device between the shared terminal among the first number of terminals and each respective functional circuit in the second plurality of functional circuits comprises forming a plurality of respective isolation circuits, corresponding in number to the second plurality of functional circuits, each respective isolation circuit being coupled to the shared power terminal and to the shared ground terminal; the method further comprising:

coupling leads from each respective functional circuit to a respective isolation circuit among the plurality of respective isolation circuits.

22. The integrated circuit device of claim 3 wherein:

the terminals in the first number of terminals comprise at least a plurality of power terminals and a plurality of ground terminals;

isolation circuits among the respective isolation circuits formed on the integrated circuit device are coupled between a shared one of the plurality of power terminals and a shared one of the plurality of ground terminals; and leads from each respective functional circuit among the plurality of functional circuits are coupled to a respective isolation circuit among the plurality of respective isolation circuits.

\* \* \* \* \*